United States Patent
Sahu et al.

(10) Patent No.: US 10,249,808 B2
(45) Date of Patent: Apr. 2, 2019

(54) SURFACE DOPING OF NANOSTRUCTURES

(71) Applicants: Ayaskanta Sahu, Berkeley, CA (US); Boris Russ, Berkeley, CA (US); Jeffrey J. Urban, Emeryville, CA (US); Nelson E. Coates, Oakland, CA (US); Rachel A. Segalman, Santa Barbara, CA (US); Jason D. Forster, Berkeley, CA (US); Miao Liu, Richmond, CA (US); Fan Yang, El Cerrito, CA (US); Kristin A. Persson, Orinda, CA (US); Christopher Dames, Berkeley, CA (US)

(72) Inventors: Ayaskanta Sahu, Berkeley, CA (US); Boris Russ, Berkeley, CA (US); Jeffrey J. Urban, Emeryville, CA (US); Nelson E. Coates, Oakland, CA (US); Rachel A. Segalman, Santa Barbara, CA (US); Jason D. Forster, Berkeley, CA (US); Miao Liu, Richmond, CA (US); Fan Yang, El Cerrito, CA (US); Kristin A. Persson, Orinda, CA (US); Christopher Dames, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/254,148

(22) Filed: Sep. 1, 2016

(65) Prior Publication Data

US 2017/0069498 A1    Mar. 9, 2017

Related U.S. Application Data

(60) Provisional application No. 62/247,310, filed on Oct. 28, 2015, provisional application No. 62/215,352, filed on Sep. 8, 2015.

(51) Int. Cl.
*H01L 29/06* (2006.01)
*H01L 35/16* (2006.01)
(Continued)

(52) U.S. Cl.
CPC .............. *H01L 35/16* (2013.01); *C01B 19/02* (2013.01); *H01L 21/02601* (2013.01);
(Continued)

(58) Field of Classification Search
CPC .......... H01L 35/16; H01L 35/18; C01B 19/02
See application file for complete search history.

(56) References Cited

U.S. PATENT DOCUMENTS 6,759,587 B2    7/2004  Toshima et al.
7,267,875 B2    9/2007  Whiteford et al.
(Continued)

OTHER PUBLICATIONS

Lynch, J., et al. Ligand Coupling Symmetry Correlates with Thermopower Enhancement in Small-Molecule/Nanocrystal Hybrid Materials. ACS Nano 8, 10528-10536 (2014).
(Continued)

*Primary Examiner* — Jesse Y Miyoshi

(57) ABSTRACT

This disclosure provides systems, methods, and apparatus related to surface doping of nanostructures. In one aspect a plurality of nanostructures is fabricated with a solution-based process using a solvent. The plurality of nanostructures comprises a semiconductor. Each of the plurality of nanostructures has a surface with capping species attached to the surface. The plurality of nanostructures is mixed in the solvent with a dopant compound that includes doping species. During the mixing the capping species on the surfaces of the plurality of nanostructures are replaced by the doping species. Charge carriers are transferred between the doping species and the plurality of nanostructures.

17 Claims, 10 Drawing Sheets

(51) Int. Cl.
  H01L 29/36      (2006.01)
  H01L 21/02      (2006.01)
  C01B 19/02      (2006.01)
  H01L 21/388     (2006.01)
  H01L 29/22      (2006.01)
(52) U.S. Cl.
  CPC ........ *H01L 21/388* (2013.01); *H01L 29/0673* (2013.01); *H01L 29/2203* (2013.01); *H01L 29/36* (2013.01)

(56) References Cited

U.S. PATENT DOCUMENTS

| | | | |
|---|---|---|---|
| 7,585,564 | B2 | 9/2009 | Whiteford et al. |
| 8,067,259 | B2 | 11/2011 | Laundry et al. |
| 8,241,943 | B1* | 8/2012 | Wieting ............ H01L 31/03923 136/262 |
| 8,492,643 | B2 | 7/2013 | Lee et al. |
| 8,563,133 | B2 | 10/2013 | Whiteford et al. |
| 8,604,331 | B2 | 12/2013 | Rhyee et al. |
| 9,065,014 | B2 | 6/2015 | Kim et al. |
| 9,130,066 | B2 | 9/2015 | Hwang et al. |
| 9,149,836 | B2 | 10/2015 | Whiteford et al. |
| 2012/0104325 | A1* | 5/2012 | Talapin .................. B82Y 30/00 252/502 |
| 2012/0111385 | A1* | 5/2012 | Ramanath .............. B82Y 30/00 136/200 |
| 2013/0280843 | A1* | 10/2013 | Perera ..................... H01L 35/34 438/54 |
| 2017/0236989 | A1* | 8/2017 | Agrawal ................. H01L 35/16 252/62.3 T |

OTHER PUBLICATIONS

Urban, J.J. Prospects for thermoelectricity in quantum dot hybrid arrays. Nature Nanotechnology 10, 997 (Dec. 2015).
Wang, R. Y., et al. Enhanced Thermopower in PbSe Nanocrystal Quantum Dot Superlattices. Nano Lett. 2008, 8, 2283-2288.
Kato, K., et al. Fabrication of Bismuth Telluride Thermoelectric Films Containing Conductive Polymers Using a Printing Method. J. Electron. Mater. 2013, 42, 1313-1318.
Kriegel, I, et al., "Tuning the Excitonic and Plasmonic Properties of Copper Chalcogenide Nanocrystals," J. Am. Chem.Soc. 2012, 134, 1583-1590.
Liu, H., et al., "Copper ion liquid-like thermoelectrics," Nature Materials 11, May 2012, 422-425.
Bell, L. E. Cooling, heating, generating power, and recovering waste heat with thermoelectric systems. Science 321, 1457-1461 (2008).
Coates, N. E. et al. Effect of interfacial properties on polymer-nanocrystal thermoelectric transport. Adv. Mater. 25, 1629-1633 (2013).
Zhuge, F. et al. Modulation of thermoelectric power factor via radial dopant inhomogeneity in B-doped Si nanowires. J. Amer. Chem. Soc. 136, 14100-14106 (2014).
Nag, A. et al. Metal-free inorganic ligands for colloidal nanocrystals: S2−, HS−, Se2−, HSe−, Te2−, HTe−, TeS32−, OH−, and NH2− as surface ligands. J. Amer. Chem. Soc. 133, 10612-10620 (2011).
Heremans, J. P. et al. Enhancement of thermoelectric efficiency in PbTe by distortion of the electronic density of states. Science 321, 554-557 (2008).
Yu, B. et al. Enhancement of thermoelectric properties by modulation-doping in silicon germanium alloy nanocomposites. Nano Lett. 12, 2077-2082 (2012).
Murray, C. B. et al. Synthesis and characterization of monodisperse nanocrystals and close-packed nanocrystal assemblies. Annu. Rev. Mater. Sci. 30, 545-610 (2000).
Rogers, J. A., et al. Materials and mechanics for stretchable electronics. Science 327, 1603-1607(2010).
Fang, H., et al. The effects of the size and the doping concentration on the power factor of n-type lead telluride nanocrystals for thermoelectric energy conversion. Nano Lett. 14, 1153-1157 (2014).
Yang, H. et al. Enhanced thermoelectric properties in bulk nanowire heterostructure-based nanocomposites through minority carrier blocking. Nano Lett. 15, 1349-1355 (2015).
Scheele, M. et al. Synthesis and thermoelectric characterization of Bi2Te3 nanoparticles. Adv. Funct. Mater. 19, 3476-3483 (2009).
Zhang, G. et al. Rational synthesis of ultrathin n-type Bi2Te3 nanowires with enhanced thermoelectric properties. Nano Lett. 12, 56-60 (2011).
Zhang, G. Q. et al. Design principle of telluride-based nanowire heterostructures for potential thermoelectric applications. Nano Lett. 12, 3627-3633 (2012).
Zhang, Q. et al. High thermoelectric performance by resonant dopant indium in nanostructured SnTe. Proc. Natl. Acad. Sci. USA 110, 13261-13266, (2013).
Talapin, D. V. & Murray, C. B. PbSe nanocrystal solids for n- and p-channel thin film field-effect transistors. Science 310, 86-89, (2005).
Chuang, C.-H. M., et al. Improved performance and stability in quantum dot solar cells through band alignment engineering. Nature Mater. 13, 796-801 (2014).
Sahu, A., et al. Interface Engineering for High Performance Thermoelectric Nanocomposites, AIChE Annual Meeting, Nov. 20, 2014.
Sahu, A., et al. Interface Engineering for High Performance Thermoelectric Nanocomposites, MRS Fall 2014 Meeting, Dec. 4, 2014.
Snyder, G.J., et al. Improved thermoelectric cooling based on the Thomson effect. Physical Review B 86, 045202 (2012).

* cited by examiner

SURFACE DOPING OF NANOSTRUCTURES

RELATED APPLICATIONS

This application is claims priority to U.S. Provisional Patent Application Ser. No. 62/215,352, filed Sep. 8, 2015 and to U.S. Provisional Patent Application Ser. No. 62/247,310, filed Oct. 28, 2015, both of which are herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to nanostructures and more particularly to the surface doping of nanostructures.

BACKGROUND

While interfaces are typically viewed as a dividing layer between two neighboring materials, the properties of the interface are at times radically different from the constituent materials. In nanomaterials, nearly 20% to 30% of the total atoms are located at or very close to the surface. Nanomaterials thus provide an ideal platform to study these effects. Rational engineering of the interfaces between two different components of a nanomaterial presents an opportunity for creating materials with novel properties that cannot be achieved otherwise.

SUMMARY

Using inorganic nanostructures and surface-bound species as dopants, nanoscale interface engineering to facilitate novel macroscale transport behavior has been demonstrated. The methods disclosed herein comprise attaching an ionic species, small molecule, or polymer to a nanostructure wherein the ionic species, small molecule, or polymer dopes the nanostructure or vice versa by charge transfer from one component to the other. This surface doping strategy enables an ability to take an intrinsically p-type (or n-type) material and controllably transform it into a robust n-type (or p-type) material, whose properties are stable over months of testing.

Methods disclosed herein may use environmentally benign, inexpensive molecules which retain the solution processability of the nanostructure or even add solution processability to an otherwise insoluble nanostructure after the attachment of a species to the surface of a nanostructure. Solution processability of surface-doped nanomaterials may enable scalable processing, such as spray coating, reel-to-reel coating, ink-jet printing, and roll-to-roll printing.

Moreover, the ions, small molecules, or polymeric materials attached to the surface of a nanostructure may passivate exposed surface sites on the nanostructure and prevent oxidation and/or any other unwanted redox reactions on the interface. The methods may allow for the control over the level of doping of nanomaterials and consequently the transport behavior of the nanomaterials. For example, stable and robust p-type, n-type, and ambipolar characteristics from the same material system may be generated. This control and tunability in engineering carrier transport also holds potential for furthering the development of next-generation light-emitting devices, optoelectronic, thermoelectric, and switching devices.

It is difficult to modulate charge carrier concentrations or the dominant charge carrier in degenerately doped semiconductors. Using surface-doping to tune the dominant charge transport species from holes (or electrons), to ambipolar transport (both electrons and holes), to electrons (or holes), with additional modulation of carrier concentration through gating, provides a platform for fabricating gated devices with switchable p-n behavior. The surface doped nanostructures may be stable in an ambient environment for months and show stable electronic and thermoelectric properties over multiday continual operation.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1:
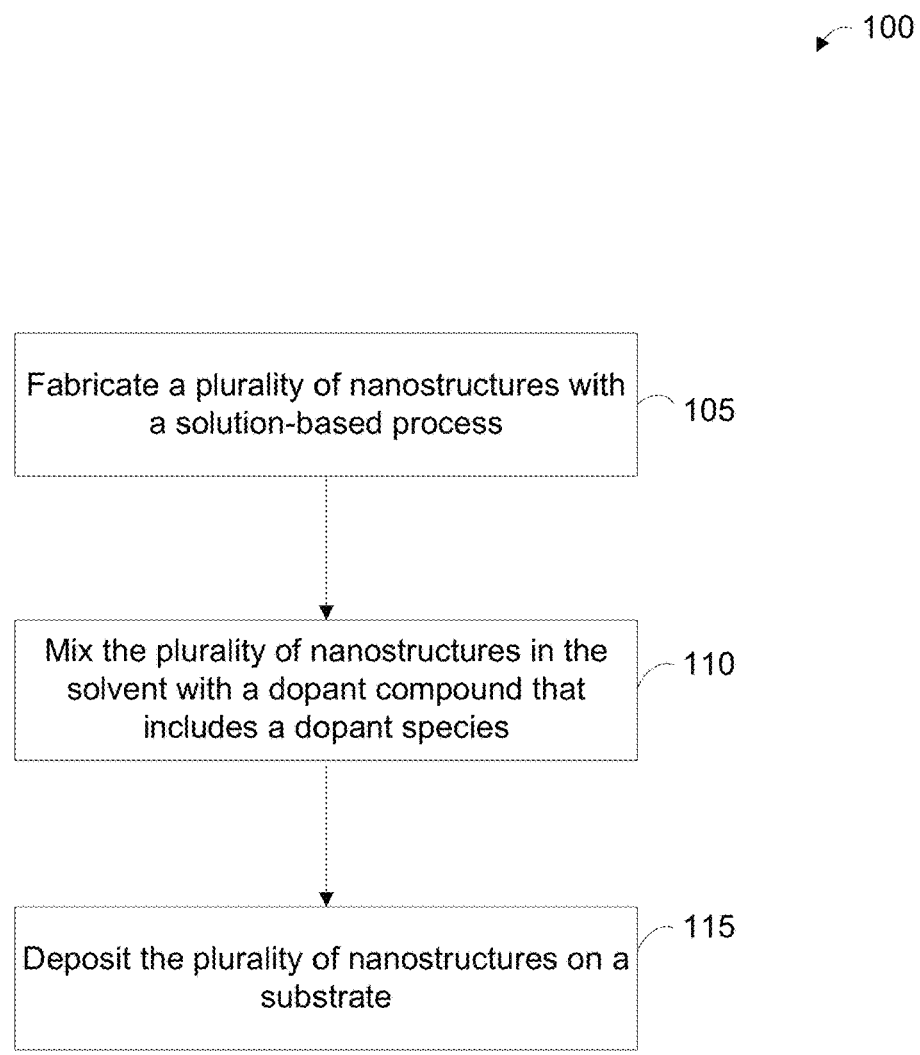
FIG. 1 shows an example of a flow diagram illustrating a process for fabricating surface-doped nanostructures.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 90% of the targeted value, within 95% of the targeted value, or within 99% of the targeted value.

The methods disclosed herein are applicable to all semiconducting nanomaterials. In this disclosure, the disclosed methods are applied to thermoelectric nanomaterials. For example, in one application, n-type and p-type thermoelectric materials (with the p-type and n-type materials having comparable power factors) can be used in a single material-based solution-processed flexible thermoelectric generator.

With the worldwide demand for energy and thermal management rapidly accelerating, thermoelectric devices, which can convert thermal energy to electrical energy (and vice-versa), are receiving increasing attention for power generation, waste heat recovery, and solid-state cooling. The efficiency of a thermoelectric material is determined by a dimensionless figure-of-merit, $ZT=S^2\sigma T/\kappa$, where S denotes the thermopower (or Seebeck coefficient), $\sigma$ the electrical conductivity, $\kappa$ the thermal conductivity, and T the absolute temperature. Due to the inherent coupling of the parameters S, $\sigma$, and $\kappa$, designing high ZT materials remains an ongoing challenge. Even though progress has been made in individual p- and n-type materials with several ZT's now reported above 2, thermoelectric device ZT's have remained at ~1, impaired by the difficulty of optimally matching power and thermal impedances of the p- and n-type materials for a specific operational temperature range. Moreover, typical processing techniques used with solid-state oxides and chalcogenides (e.g., metal oxide chemical vapor deposition), require high temperatures and generate rigid form factors and often brittle devices. Described herein is a general strategy for developing solution-processed "monomaterial" thermoelectrics, in which the same base material can serve as both p- and n-legs of the device, which may aid in solving the aforementioned optimization issues. This methodology is based upon true band conversion or band tuning of materials resulting from nanoscale chemical resurfacing, which effectively dopes the materials.

Historically, advances in nanostructured thermoelectric materials have capitalized primarily on enhanced phonon scattering and attendant reduction of $\kappa$ for improved performance, and the large chemically accessible interfacial surface area inherent to all nanomaterials has proven, in many cases, to be a net detraction due to enhanced boundary scattering of electrical carriers. However, it can provide a mechanism for manipulating the electronic component of thermoelectric transport (S and $\sigma$). Bound ligands, tailored through solution-processed ligand exchange, can potentially enable doping of the parent nanomaterials by charge transfer at the interface or by hybridizing and modifying local densities of states (DOS). Such solution surface modification can be coupled with colloidal bottom-up synthesis of nanomaterials in a low-cost and high-throughput commercially viable process yielding dimensionally and chemically precise structures.

Reports utilizing solution-processed nanomaterials without additional energy intensive (and costly) post-processing, such as spark-plasma-sintering (SPS), are limited. In contrast, described herein is surface modulation approach to chemically dope tellurium (Te) nanowires, a prototypical p-type thermoelectric material, converting them into stable, n-type Te nanowires. By precisely controlling the doping level, the Fermi level ($E_F$) of films cast from these Te nanowires can be monotonically shifted with fine gradation (spanning a range of ~1000 μV/K with steps of about tens of μV/K in Seebeck coefficient) from p-type to n-type behavior. No other known approach has demonstrated such fine control over thermoelectric transport coefficients while leaving the lattice intact. These nanowire-films are stable over days under constant operation and can be integrated into flexible substrates with both the p- and n-legs fabricated via solution processing. More generally, these results suggest that interface engineering of nanostructures holds great potential for driving forth the next generation of hybrid materials for applications in p-n based logic, transistors, optoelectronics, and thermoelectrics.

Figure 2A:
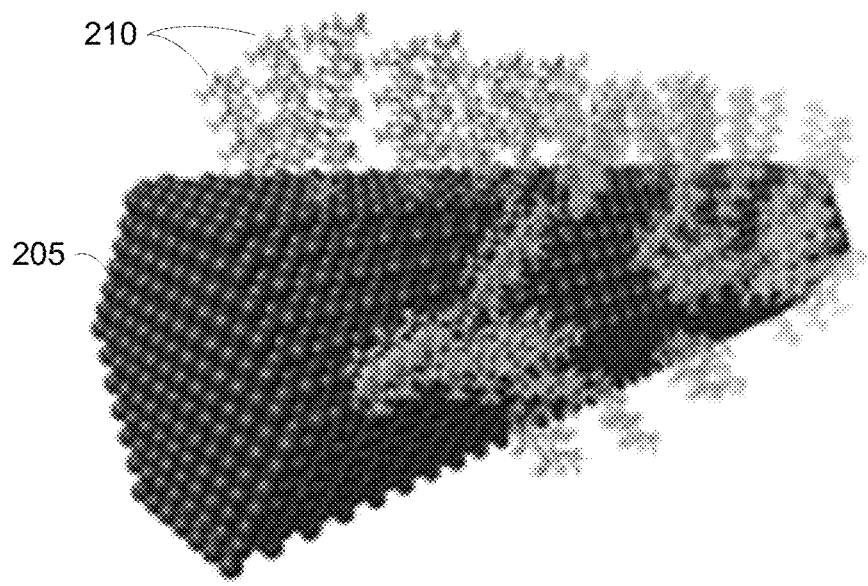
FIGS. 2A-2C show examples of schematic illustrations of a nanostructure at different stages in the process described in FIG. 1.
Figure 2B:
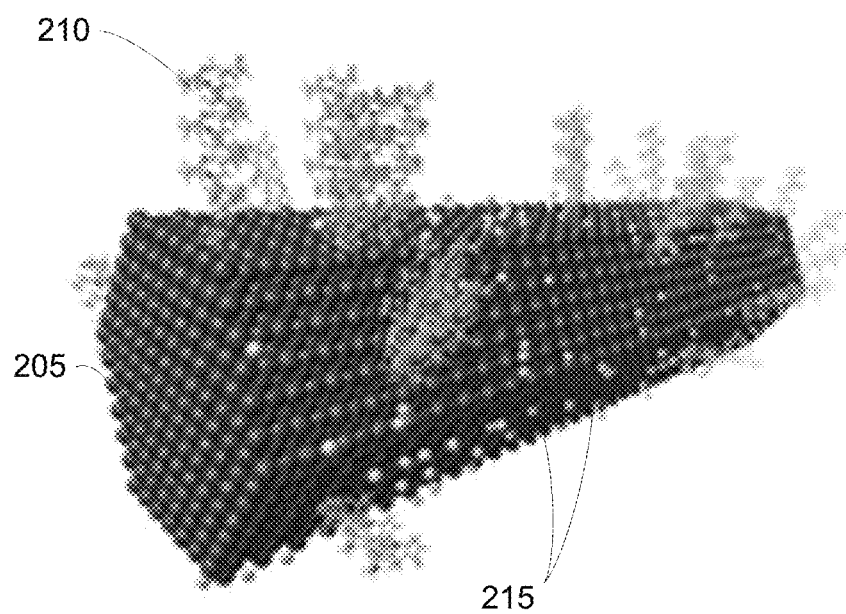
Figure 2C:
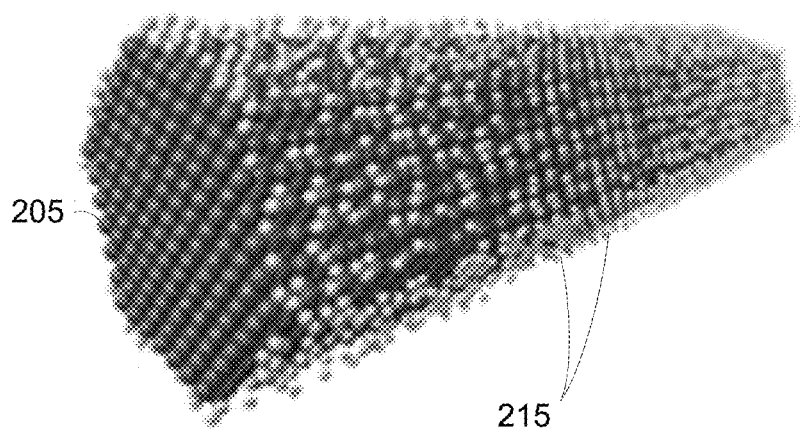

FIG. 1 shows an example of a flow diagram illustrating a process for fabricating surface-doped nanostructures. FIGS. 2A-2C show examples of schematic illustrations of a nanostructure at different stages in the process described in FIG. 1.

Starting at block 105 of the method 100, a plurality of nanostructures are fabricated with a solution-based process. Each of the plurality of nanostructures has a surface with capping species attached to the surface. The solution-based process uses a solvent. In some embodiments, the solvent is an organic solvent or water. Examples of organic solvents include alcohols and octane. When water is used as a solvent, the solution is called an aqueous solution. There are many known methods of fabricating nanostructures with solution-based processes.

In some embodiments, the nanostructures comprise nanowires, nanorods, nanoparticles, or quantum dots. In some embodiments, the nanostructures comprise nanowires, and the nanowires are about 10 nanometers (nm) to 500 nm in diameter and about 100 nm to 50 microns in length. In some embodiments, the nanostructures comprise nanoparticles, and the nanoparticles have a dimension of about 10 nm to 500 nm. For example, when the nanoparticles are spherically shaped, the nanoparticles may have a diameter of about 10 nm to 500 nm.

In some embodiments, the nanostructures comprise a semiconductor material. In some embodiments, the nanostructures comprise a low-band gap semiconductor material. As described further below, the method 100 has been used to surface-dope tellurium nanowires with sulfur. The fact that the dominant charge transport species (i.e., holes or electrons) can be changed for tellurium nanowires (tellurium is a low-band gap semiconductor having a high carrier concentration) implies that it may be easier to change the dominant charge transport species for large-band gap semiconductors, which have lower charge carrier concentrations, in some embodiments, the nanostructures comprise a material selected from a group consisting of tellurium, selenium, bismuth telluride, bismuth selenide, and alloys thereof. In some embodiments, the nanostructures comprise a material selected from a group consisting of copper telluride/sulfide, lead sulfide/telluride/selenide, and cadmium sulfide/telluride/selenide.

In some embodiments, the capping species comprise a species selected from a group consisting of atomic species, molecular species, and polymeric species. The capping species may serve to passivate the surfaces of the plurality of nanowires. A passivated surface refers to a surface that is less affected by environmental factors, such as air and water, for example.

FIG. 2A shows an example of a nanostructure at this point in the process 100 (e.g., up to block 105). In FIG. 2A, a nanostructure 205 comprises a nanowire. Disposed on the surface of the nanostructure 205 are capping species 210. In FIG. 2A, the capping species 210 comprise a polymer.

At block 110 of the process 100, the plurality of nanostructures in the solvent are mixed with a dopant compound that includes doping species. In some embodiments, the doping species comprise a species selected from a group consisting of atomic species, molecular species, and polymeric species. During the mixing, the capping species on surfaces of the plurality of nanostructures are replaced by the doping species. Charge carriers (i.e., holes or electrons) are transferred between the doping species and the plurality of nanostructures. In some embodiments, the doping species inject charge carriers into each of the plurality of nanostructures. In some embodiments, each of the plurality of nanostructures injects charge carriers into the doping species. For example, in some embodiments, the plurality of nanostructures comprise a p-type semiconductor, and the transfer of charge carriers between the plurality of nanostructures and the doping species changes the plurality of nanostructures to an n-type semiconductor. In some embodiments, the plurality of nanostructures comprise an n-type semiconductor, and the transfer of charge carriers between the plurality of nanostructures and the doping species changes the plurality of nanostructures to a p-type semiconductor.

Surface doping of a nanostructure in this manner does not distort the atomic structure or crystalline lattice of the nanostructure material. This is in contrast to conventional methods of doping semiconductors, in which atoms are incorporated into a semiconductor material (e.g., phosphorus or boron incorporated into silicon). These atoms distort the atomic structure of the semiconductor material.

The material of the plurality of nanostructures and the doping species are selected based on the interaction between the nanostructures and the doping species and the band (i.e., conduction band and valence band) alignments between the nanostructures and the doping species. Regarding the interaction between the nanostructures and the doping species, the binding energy between atoms of the nanostructure and the doping species determines the nature of the interaction. Any physical interaction (generally a weak interaction) or chemical interaction (generally a strong interaction) between the nanostructure and the doping species that results in an energy transfer may be a potential combination of interest. Chemical interactions will generally will have larger effects compared to physical interactions. For example, strong chemical interactions can result in hybridization such that the nanostructure that is surface doped with the doping species is functionally different from either the nanostructure or the doping species.

The band alignments between the nanostructure and the doping species determine the nature of the energy transfer between the nanostructure and the doping species and the doping of the nanostructure (e.g., n-type or p-type doping); energy transfer refers to whether hole or electron charge carriers are being transferred to/from the doping species. For example, electrons on the dopant species may reside at a specific energy level which is higher (e.g., by about 0.01 eV to 1 eV) than the conduction band energy level of the nanostructure. When the dopant species attach to the nanostructure, electrons will flow from the dopant species to the nanostructure in order to minimize the overall energy of the system. This charge carrier transfer process can also happen in reverse. For example, if the valence band energy level of the nanostructure is at a higher level (e.g., by about 0.1 eV to 1 eV) than the conduction band energy level (or LUMO for organic species (lowest unoccupied molecular orbital)) of the dopant species, electrons will be extracted from the nanostructure by the dopant species, leading to p-type doping.

In some embodiments, the nanostructure and doping species have energy levels as described in the previous paragraph. For example, for electron transfer, the energy level of the conduction band of the nanostructure should be close to the energy level of the electrons of the dopant species (e.g., about 0.01 eV to 0.5 eV separating the energy levels). For hole transfer, the energy level of the valence band of the nanostructure should be close to the energy level of holes of the dopant species (e.g., about 0.01 eV to 0.5 eV separating the energy levels). In some embodiments, the number density of the energy levels (i.e., the density of states) determines the quantity of charge carriers that each material can accommodate when a charge carrier transfer occurs.

Dopant species being weakly bound to a nanostructure (i.e., low binding energy) may be referred to as physical adsorption of the dopant species; dopant species may be physically attached to or disposed on the nanostructure. Dopant species being strongly bound to a nanostructure (i.e., high binding energy) may be referred to as chemical adsorption of the dopant species; in some instances, there may be a chemical bond between the dopant species and the nanostructure. In this case, bond reorganization may occur at the interface of the doping species and the nanostructure, which may result in a change in the band structure of the nanostructure with the doping species disposed thereon. In the case of physical adsorption, due to weaker interaction between the dopant species and the nanostructure, the extent of charge carrier transfer will be less as compared to chemical adsorption.

The method 100 may be used with any number of different nanostructures and doping species. Again, examples of nanostructure materials include tellurium, selenium, bismuth telluride, bismuth selenide, and alloys thereof, copper telluride/selenide, lead sulfide/telluride/selenide, and cadmium sulfide/telluride/selenide. Examples of doping species include sulfur, selenium, and F4TCNQ: (2,3,5,6-Tetrafluoro-2,5-cyclohexadiene-1,4-diylidene)dimalononitrile, 7,7,8,8-Tetracyano-2,3,5,6-tetrafluoroquinodimethane.

The doping compound is soluble in the solvent. For example, when the solvent comprises water, the doping compound may comprise a salt. Salts generally are ionic compounds composed of cations and anions. The component ions can be inorganic (i.e., forming an inorganic salt) or organic (i.e., forming an organic salt). The doping species that is part of the doping compound may comprise atomic species, molecular species, or polymeric species.

In some embodiments, the mixing operation includes agitating the plurality of nanostructures and the dopant compound that are mixed in the solvent. For example, agitating the plurality of nanostructures and the dopant compound that are mixed in the solvent may include stirring the mixture of the components. In some embodiments, the agitation occurs for about 6 hours to 48 hours, or about 24 hours to 48 hours.

In some embodiments, the doping species have a larger binding energy to surfaces of the plurality of nanostructures than the capping species. In these embodiments, the doping species will preferentially attach to the surfaces of the nanostructures.

In some embodiments, a portion of the capping species are replaced by the doping species on the surfaces on the nanostructures. FIG. 2B shows an example of such a nanostructure at this point in the process 100 (e.g., up to block 110). In FIG. 2B, the nanostructure 205 comprises a nanowire and has capping species 210 disposed on its surface and doping species 215 disposed on its surface. In FIG. 2B, the doping species 215 comprise atoms. In FIG. 2B, all of the capping species 210 have not been replaced with doping species 215.

In some embodiments, all of the capping species are replaced by the doping species on the surfaces of the nanostructures. FIG. 2C shows an example of such a nanostructure at this point in the process 100 (e.g., up to block 110). In FIG. 2C, the nanostructure 205 comprises a nanowire and has doping species 215 disposed on its surface. In FIG. 2C, the doping species 215 comprise atoms. In FIG. 2C, all of the capping species 210 have been replaced with doping species 215.

The degree to which the capping species are replaced by the doping species depends in part on the concentration of the doping compound mixed with the plurality of nanostructures. For example, if only enough doping compound is mixed with the plurality of nanostructures so that 50% of the capping species can be replaced by the doping species, not all of the capping species will be replaced with doping species.

The degree to which the capping species are replaced by the doping species also depends on the amount of time that the plurality of nanostructures are mixed with the doping compound. For example, if the nanostructures are mixed with the doping compound for a short period of time, only a portion of the capping species may be replaced by the doping species. If the nanostructures are mixed with the doping compound for an extended period of time, all of the capping species may be replaced by the doping species. By controlling the amount of doping compound mixed with the plurality of nanostructures and the time over which the doping compound is mixed with the plurality of nanostructures, the amount of doping species disposed on the surfaces of each of the nanostructures (and level of doping of each of the nanostructures) can be varied.

The degree to which a nanostructure is doped by surface dopants also depends on the size of the nanostructure. The amount of surface area of a nanostructure varies inversely with the size of a nanostructure (e.g., diameter or cross-sectional area); larger nanostructures cannot be surface doped as much as smaller nanostructures. Thus, the amount of doping species on the surface of a nanostructure also depends on the size of the nanostructure. For example, when doping nanowires with an atomic doping species, the atomic concentration of the doping species for a 10 nm diameter nanowire can be about 0.1% to 15%. For an 80 nm diameter nanowire with an atomic doping species, the atomic concentration of the doping species can be about 0.1% to 2%.

The doping species bind to the surfaces of the plurality of nanostructures via adsorption. Adsorption is the adhesion of atoms, ions, or molecules to a surface. In some embodiments, the adsorption is physical adsorption or chemical adsorption. In some embodiments, the adsorption is a combination of physical adsorption and chemical adsorption.

In some embodiments, the amount of the doping species disposed on the surface of a nanostructure determines whether the nanostructure is a p-type semiconductor or an n-type semiconductor. In some embodiments, a nanostructure comprising an intrinsically p-type semiconducting material can be made to be an n-type semiconductor with surface doping. In some embodiments, a nanostructure comprising an intrinsically n-type semiconducting material can be made to be a p-type semiconductor with surface doping. In some embodiments, a nanostructure comprising a semiconducting material is a p-type semiconductor with no doping species disposed on the surface of a nanostructure or with a first amount of the doping species disposed on the surface of a nanostructure. A nanostructure comprising the semiconducting material is an n-type semiconductor with a second amount of the doping species disposed on the surface of a nanostructure, with the first amount and the second amount of the doping species not being the same amounts. For example, the second amount of the doping species may be greater than the first amount of the doping species.

In some embodiments, the nanostructure is an intrinsically p-type semiconducting material and the doping species increases the p-type character of the nanostructure. In some embodiments, the nanostructure is an intrinsically n-type semiconducting material and the doping species increases the n-type character of the nanostructure.

In some embodiments, the doping species do not desorb from the plurality of nanostructures in a time period of about 7 months or about 13 months (i.e., a time period of over about 1 year). Desorption is a phenomenon whereby a substance is released from or through a surface. The process is the opposite of sorption (i.e., either adsorption or absorption).

Returning to FIG. 1, at block 115 of the process 100, the plurality of nanostructures are deposited on a substrate. In some embodiments, plurality of nanostructures is solution-processable after block 110. Solution processable refers to the nanostructures able to be dispersed/suspended in a solution of interest. In some instances, solution-processability also means that components of a material in solution do not aggregate and precipitate from solution over time. This may allow for the solution to be handled like an ink. In some embodiments, plurality of nanostructures is solution-processable using a water-based solution (i.e., an aqueous solution) after block 110. In some embodiments, the deposition is performed using spray coating, reel-to-reel coating, ink-jet printing, roll-to-roll printing, or drop casting. Solution processing is distinct from vapor phase processing, such as vapor deposition, for example.

In some embodiments, the plurality of nanostructures comprises a plurality of tellurium nanowires and the doping species comprise sulfur atoms. This combination of materials (i.e., the nanowires and the doping species) forms a thermoelectric material. The tellurium nanowires can be used to create a single material-based (i.e., tellurium) thermoelectric generator.

In an example implementation, ~80 nm diameter Te nanowires with a capping polymer (e.g., polyvinylpyrrolidone) were synthesized following methods known to one having ordinary skill in the art. After numerous rounds of purification of the Te nanowires with water and methanol (typically 4 to 5), the resulting nanowires were dispersed in de-ionized water and were stored in ambient conditions until needed.

For example, Te nanowires can be synthesized by reducing a tellurium salt or precursor (e.g., such as tellurium dioxide, sodium tellurite, potassium tellurite, or orthotelluric acid) into tellurium nuclei and growing these nuclei into nanowires by a structure directing agent. Appropriate reducing agents include hydrazine, hydrazine hydrate, or ascorbic acid, for example. Structure directing agents are typically polymers such as PVP (polyvinylpyrrolidone) or PEDOT:PSS (poly(3,4-ethylenedioxythiophene) polystyrene sulfonate), for example. Te nanowires can also be synthesized using a dissolution-recrystallization process wherein post nucleation, the amorphous nuclei slowly dissolve into solution and recrystallize into a nanorod/nanowire geometry. In some instances, the method using structure directing agents may provide greater flexibility and control over the size and shape of nanowires than other methods.

In an example implementation of fabricating Te nanowires using structure directing agents, 0.6 grams of PVP, 1.8 grams of NaOH (or KOH) to control the pH, and 1.45 grams of tellurium oxide were mixed in 60 mL of ethylene glycol in a 100 mL round bottomed flask. Water, instead of ethylene glycol, could also be used as a reaction solvent. Under a nitrogen atmosphere, the reagents were heated up to 160° C. and 1.8 mL of hydrazine hydrate was added to the mixture. A growth time of nearly one hour yielded uniform tellurium nanowires. The mixture was cooled down and the Te nanowires are cleaned multiple times with water and ethanol to remove any unreacted reagents. The Te nanowires can be resuspended in polar solvents, such as water, methanol, or ethylene glycol, for example. The sizes and shapes of the nanowires can be controlled by reactant concentrations, growth temperatures, growth time, the molecular weight of the PVP, and the pH of the solution (e.g., quantity of NaOH added to the mixture). Additives, such as sodium borohydride, hydrochloric acid, sodium hypophosphite, cetylammonium bromide, and cellulose, for example, can also be added to control the nucleation and growth of the Te nanowires.

The Te nanowires were then mixed with a metal sulfide salt, $Na_2S$ in this case. Other salts could also be used, including $K_2S$. A typical reaction involved adding requisite amounts of $Na_2S$ to a 4 to 5 mg/ml dispersion of Te nanowires in water in a glass jar with continuous stirring overnight (~16 hours). After the reaction was stopped, the doped nanowires were centrifuged for ~45 minutes. While the nanowires fell out of the dispersion, any unreacted $Na_2S$ and polyvinylpyrrolidone stripped from the nanowires remained in the supernatant which was discarded. The precipitated nanowires were redispersed in water and isolated again with centrifugation. The process was repeated at least 4 times to ensure the removal of any unbound species and obtain a clean product. Finally, the nanowires were resuspended in ultrapure 18 MΩ water and stored for further use.

The doping concentration was tuned by changing the concentration of sulfur ions ($S^{2-}$) in solution. The doped nanowires retain their solution processability and were stable for months under ambient conditions. It is postulated that the $S^{2-}$ dopants first penetrate the polymer coating on the as-synthesized nanowires and attach to any unpassivated surface Te atoms. Increasing the dopant concentration gradually expels the polymer coating, thus creating more surface sites for $S^{2-}$ attachment. Finally, in the heavily doped limit, almost all the polymer is displaced and the nanowire surface is fully coated with $S^{2-}$ dopants. Transmission electron micrographs (TEM) showed that the nanowires retained their size and crystallinity even at the highest doping concentration.

Figure 3A:
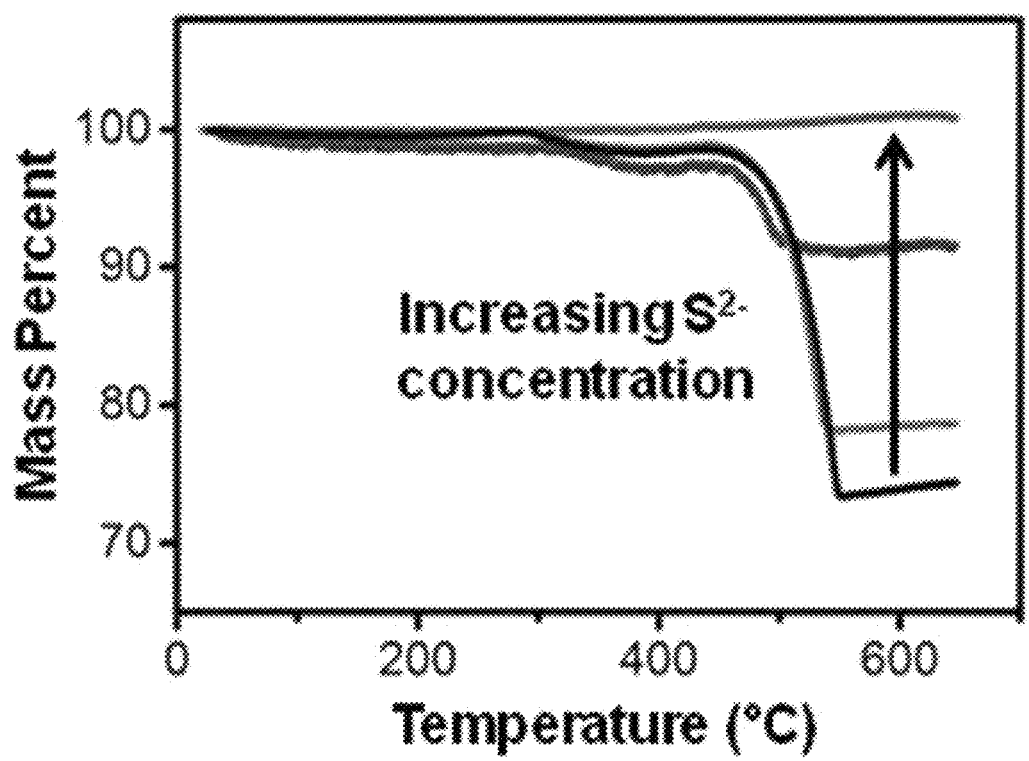
FIG. 3A shows the results of a thermogravimetric analysis of undoped Te nanowires and doped Te nanowires (1.2%, 1.5%, and 2.4% dopant concentration).
Figure 3B:
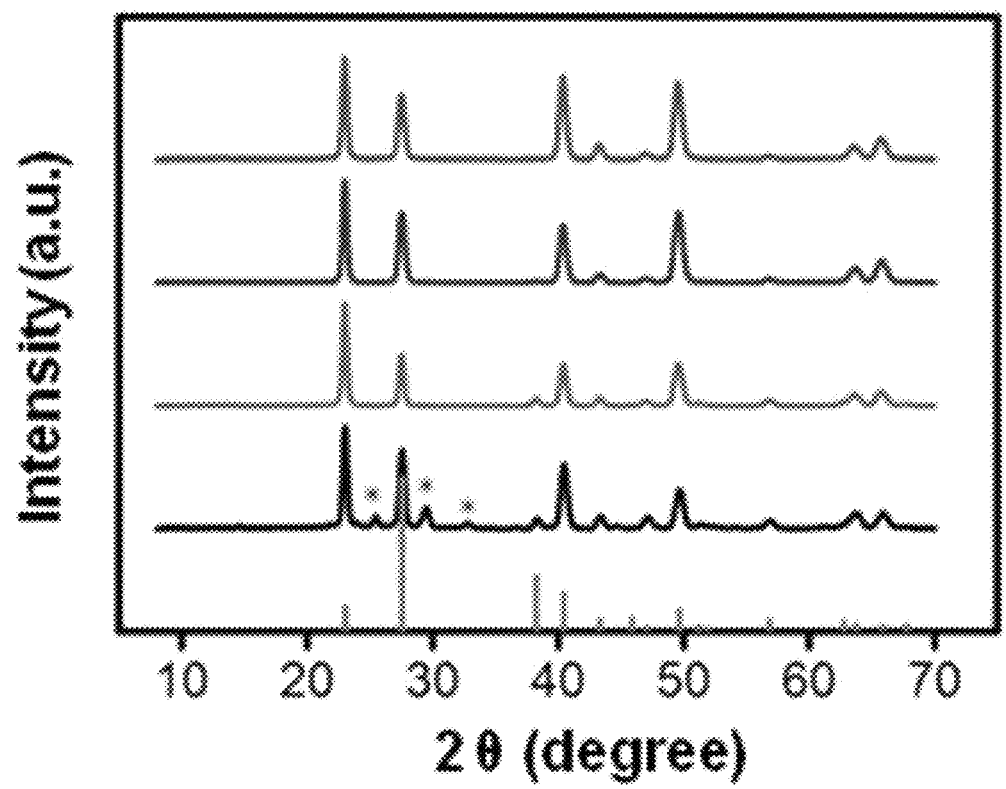
FIG. 3B shows X-ray diffraction patterns for undoped Te nanowires (bottom pattern) and doped Te nanowires (1.2%, 1.5%, and 2.4% dopant concentration, the second, third, and fourth patterns from the bottom, respectively). The bars denote the reference peaks for pure Te while the asterisks show peaks from $TeO_2$.

To analyze the polymer concentration on the Te nanowires, thermogravimetric analyses on various samples with different dopant concentrations were performed, the results of which are shown in FIG. 3A. A significant and monotonic loss in polymer mass as a function of increased doping was observed, which corroborates well with the TEM results and the assumption that $S^{2-}$ dopants slowly displace the polymer. X-ray diffraction (XRD) patterns shown in FIG. 3B also showed no significant changes in Te-structure as a function of dopant concentration. One advantage of the processes described herein over other chemical doping methods for nanomaterials is the absence of any Te-oxidation in the doped samples even after weeks of exposure to ambient conditions. As-synthesized Te nanowires did oxidize within the same time frame. This proves that even in the extremely lightly doped limit, the $S^{2-}$ dopants specifically target and serve to passivate any vacant surface Te-site which might be prone to oxidation and provide remarkable stability.

Figure 4A:
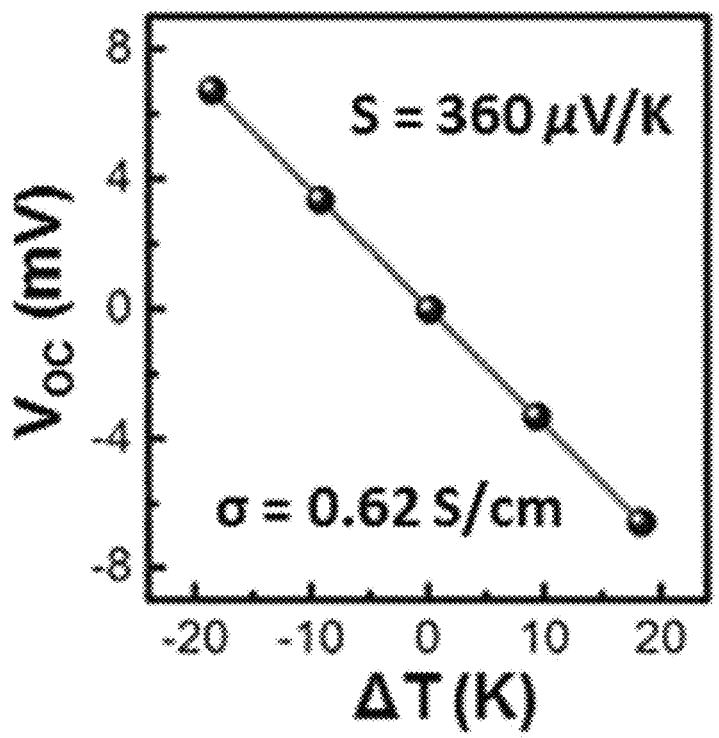
FIG. 4A shows the open circuit voltage versus applied temperature gradient for a film formed with as-fabricated (i.e., with polyvinylpyrollidone disposed on the surface) Te nanowires.
Figure 4B:
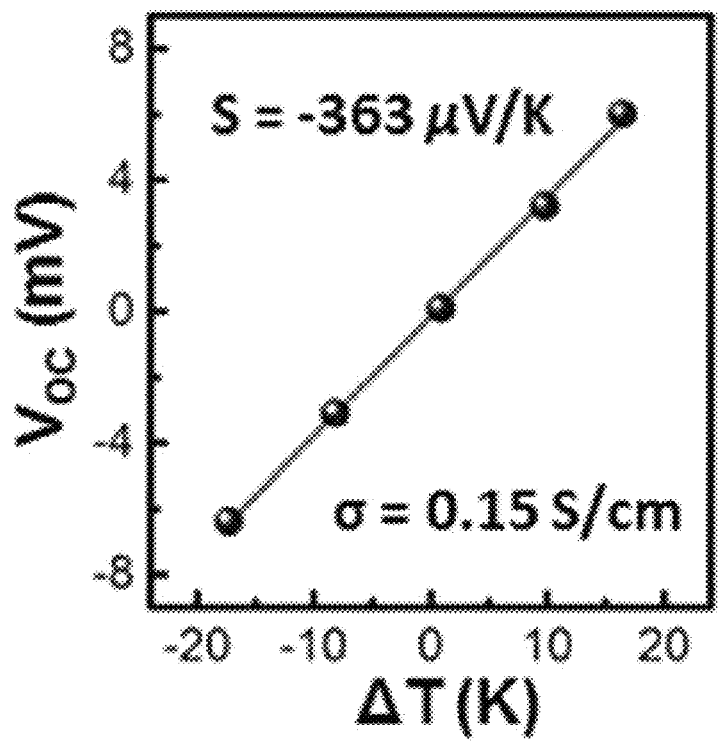
FIG. 4B shows the open circuit voltage versus applied temperature gradient for a film formed with surface doped (i.e., with $S^{2-}$) Te nanowires.

The dispersability of the Te nanowires allowed for the formation of smooth films on various substrates via casting techniques, including drop-casting. In some embodiments the films formed were porous and comprised a dense interconnected network of nanowires. While the doped Te nanowire-films (~2.4% atomic concentration of dopant) showed no apparent change in structure or morphology, electronic changes in the thermoelectric properties of these wires were observed. While the thermopower of as-synthesized Te nanowires was positive as shown in FIG. 4A, the thermopower switches sign and was negative for the doped nanowires as shown in FIG. 4B. The thermopower or Seebeck coefficient is derived from the slope of the linear fit in FIGS. 4A and 4B. The sign of the thermopower of a material is a reliable indication of the nature of the majority charge carriers in that material, and the incorporation of the surface $S^{2-}$ dopant unambiguously switches Te from p-type to n-type.

One might expect the negatively charged S-dopants to donate electrons to Te nanowires to dope them n-type. In general, however, predicting the effects of doping are not trivial; for example, deep defect levels in the host material might scavenge these carriers and remove them from the conduction band. Additional complications often arise with nanoscale materials since undesirable redox reactions will occur more readily in ambient conditions due to the larger surface energy relative to bulk crystals.

In order to gain a greater understanding of the doping mechanisms at work with these surface dopants, the charge transfer effect between S-adatoms and Te on the (010) surface (because it is the most stable and exposed surface) was examined using density functional theory (DFT) calculations. To gain insight as to how electron doping is induced by sulfur adsorption, the charge transfer effect directly between sulfur and Te was calculated based on two extreme cases: physical adsorption from weak van-der-Waals forces and chemical adsorption with strong bonding. Structures were relaxed fully to equilibrium configurations for all atoms in all directions. In both cases, the charges were redistributed between the S-adatoms and the Te lattice, and form localized dipole moments at the Te/S interface with a penetration depth of ~3-4 Te atomic layers in general. By integrating charge transfer in the in-plane direction of the film, the amount of change redistribution between S-adatoms and the Te slab was extracted along the surface-normal direction. The results indicated that sulfur attracts electrons more prominently while Te loses electrons and becomes slightly positively charged, resulting in a negatively charged surface region around the surface-bound S-atoms. This charge redistribution behavior can be understood by the higher electronegativity of sulfur compared to Te, which results in sulfur generally exhibiting a stronger tendency for attracting electrons than Te. While isovalent dopants are not perceived as traditional dopants, recent studies have shown that it is indeed possible to dope a material with a corresponding element exhibiting the same valence state. These results are in good agreement with the experimental observations and confirm the proposed mechanism that sulfur adsorption can indeed induce n-doping at the interface in the hybrid Te/S material system through charge transfer.

Figure 5:
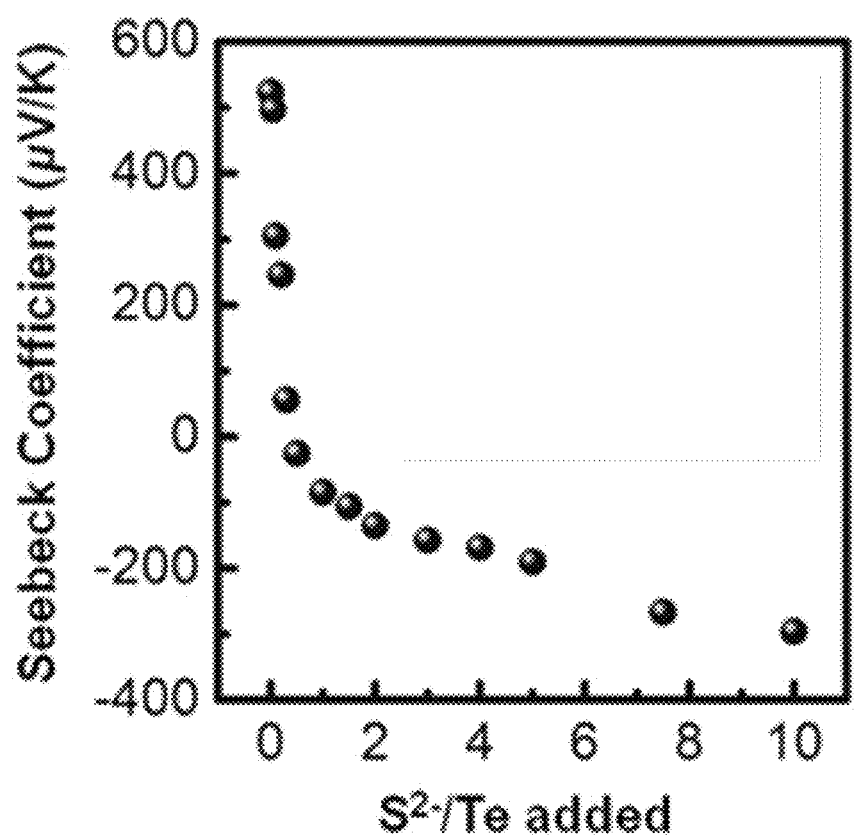
FIG. 5 shows the Seebeck coefficient from a series of doped Te nanowire samples versus the amount of $S^{2-}$ added to the exchange solution, normalized to the total number of Te atoms present on the surface of the nanowire.

An inherent advantage of the surface doping technique described herein is that it automatically generates a control sample for tracking changes due to doping. In other approaches, where the impurities are generally added during the growth of the nanostructure, it remains challenging to synthesize samples that differ only in dopant concentration without disrupting the size, shape, or crystallinity of the samples. A benefit of this surface doping approach is that an entire series of samples that only differ by the amount of $S^{2-}$ added can be prepared. The size, morphology, and crystallinity of the nanostructures remains otherwise identical—another feature of this approach relative to substitutional doping where undesirable ionized-impurity scattering can be enhanced as a by-product of doping. FIG. 5 shows a plot of the Seebeck coefficient of Te nanowires versus the amount of $S^{2-}$ added in the initial solution. A consistent monotonic decrease in the Seebeck coefficient with increasing $S^{2-}$ addition is observed. This trend is apparent across samples from different synthetic batches, which points towards a mechanism of controlled $S^{2-}$ incorporation.

The monotonic decrease of the value of the Seebeck coefficient from positive to negative is consistent with the view that the location of the $E_F$ in the deposited film is shifted away from the valence band towards the conduction band, slowly transforming Te from a p-type to an n-type material. While the exact origin of these effects is not yet clear, it is proposed that extra electrons fill the lowest energy states in the nanowire. Assuming bulk carrier concentrations of $4.8*10^{17}$ holes/cm$^3$ for Te gives nearly $10^4$ holes/Te-nanowire (~80 nm diameter). A simple calculation supports this notion, showing that even at 2.5% concentration, surface-bound S-dopants can donate up to $10^7$ electrons/Te-nanowire (~1000× higher than intrinsic hole concentration), thus effectively changing the nature of the majority charge carriers. Grosse et al. observed a similar effect of a negative Seebeck coefficient in Te when thermally excited electron concentrations were comparable to hole concentrations ($6.1*10^{14}$/cm$^3$).

The effect of shifting $E_F$ on the Seebeck coefficient can be explored by modelling it as a function of the position of $E_F$ in the film. In traditional thermoelectric materials, where the $E_F$ lies close to the band edge or deep within the band, a decrease in the charge carrier concentration would predict an increase in the Seebeck coefficient. However, in semiconductors such as Te where the $E_F$ lies well within the bandgap, decreasing the charge carrier concentration results in a decrease in the Seebeck coefficient due to a bipolar effect and subsequently leads to a change in its sign once the majority charge carrier inverts. This shift in the Seebeck coefficient for different doping concentrations can thus be thought of as a direct indicator of changes in the $E_F$.

Controlling the charge carrier concentration, and consequently the location of the $E_F$ in a thermoelectric material, is important in obtaining high ZTs since the value of the Seebeck coefficient is determined by the band structure around $E_F$. The surface doping technique provides a new avenue for optimizing thermoelectric transport by using chemical influence and not substitutional doping. Typical thermoelectric materials are degenerately doped semiconductors with high carrier densities; thus, introducing a trace quantity of dopants is usually not sufficient to move the $E_F$ enough to maximize ZT. Instead, optimization is done by introducing a significant (~1%) amount of dopants to improve power factors ($S^2\sigma$) as well as isovalent atoms to form alloys which reduce lattice thermal conductivities [e.g. $(Bi_{1-x}Sb_x)_2Te_3$, x~0.1 to 0.2]. This alloying procedure, however, can potentially introduce drastic changes in the band structure of the host material, and the optimal $E_F$ of the alloy is often different from that of the parent semiconductor material. An alternative approach to improving thermoelectric properties demonstrated by Heremans et al. utilizes dopants to introduce a resonant DOS within the band which allows one to simultaneously increase both S and σ. However, this approach relies on the fact that the $E_F$ be within a narrow energetic window close to that sharp DOS which is not guaranteed a priori. Additionally, finding appropriate dopant-host combinations is also challenging, and only a handful of cases have been demonstrated. In contrast, the process of surface-doping nanostructured materials relies on a charge transfer mechanism similar to modulation doping which isolates dopants from the transport channel, thereby reducing ionized impurity scattering, and allowing one to preserve the semiconductor band structure, as well as controllably move the $E_F$ to an optimal level.

The process described for surface doping of Te-nanowires used environmentally benign $S^{2-}$ salts to enable an effective doping strategy that was performed in water under ambient conditions. There was good control over the doping levels of the resulting surface-doped nanowires. The surface-doped nanowire were stable for months and suitable for incorporation into true steady-state device studies. Although the thin films described were cast in air, and the metal contacts for thermoelectric transport studies were evaporated post-deposition in high vacuum, the nanowire-films retained their n-type behavior.

Figure 6A:
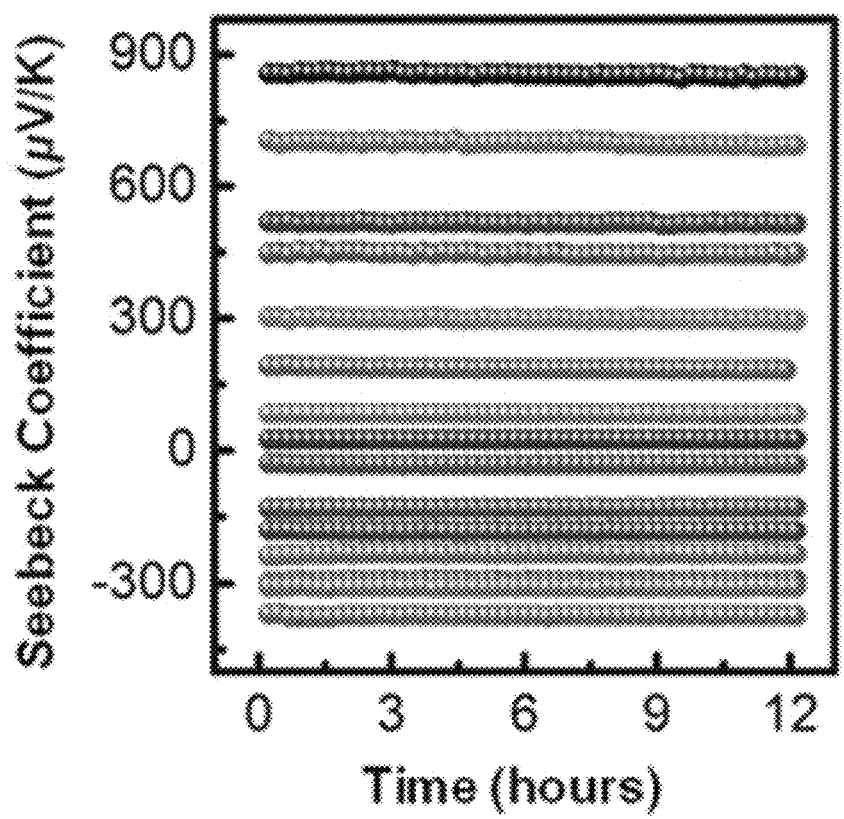
FIG. 6A shows the results of short term stability tests from a series of Te nanowire samples with varying doping concentrations.
Figure 6B:
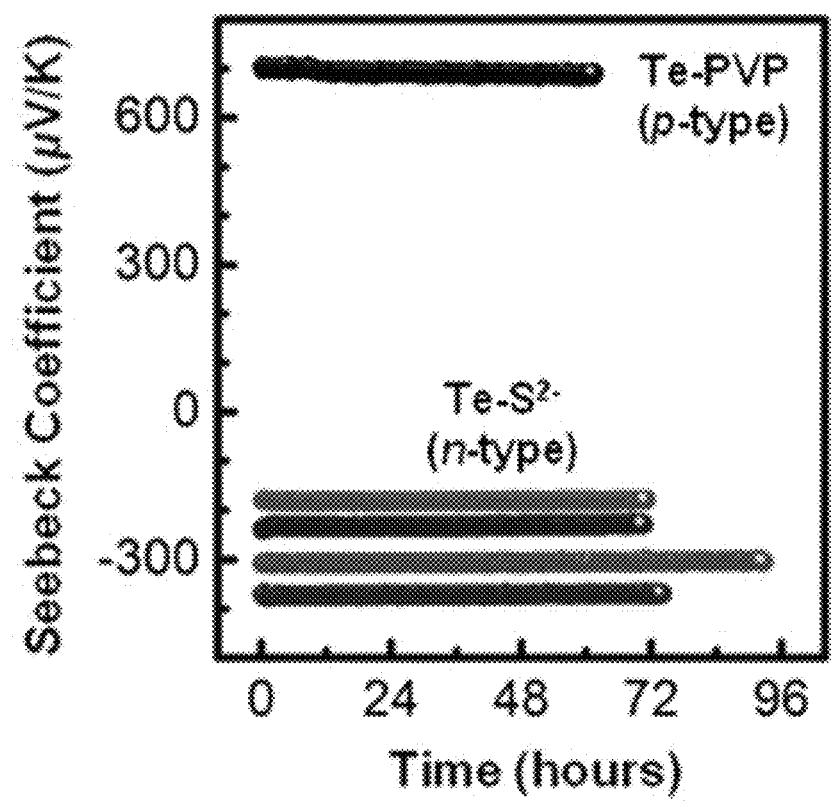
FIG. 6B shows the results of long term stability tests for as-synthesized p-type Te nanowires capped with polyvinylpyrrolidone (top plot) and multiple batches of fully surface exchanged Te nanowires with $S^{2-}$ (bottom plots). The longer bottom plot is from a sample stored in ambient conditions for nearly 7 months.

To monitor the doping stability, the thermopower, under continuous sample operation, was tracked over long time periods. FIGS. 6A and 6B present stability tests of samples over a period of 12 hours and 72 hours, respectively; the thermopower range is clearly tuned by controlling the extent of $S^{2-}$ doping. Significantly, all doped nanowires proved extremely robust, demonstrating less than 5% maximum standard deviation in the thermopower in all tested devices. This is the first reported study showing stable thermoelectric properties in doped-nanomaterials over multi-day continuous operation. Such stability is promising for integration of these materials into industrial applications.

As noted previously, the surface doping approach holds promise not only for thermoelectric applications, and also lays a solid yet facile platform for a broad class of devices based on p-n homojunctions. Evidence for n-type doping via thermopower measurements has been shown (open-circuit). To demonstrate the generality of this approach for other classes of electronic devices such as diodes and transistors, the Te nanowire films needed to be tested under bias. All of the observed trends in the Seebeck coefficient in the $S^{2-}$-doped Te nanowires were in agreement with electrolyte-gated thin-film transistors measurements where electrical transport properties of the doped nanowire films were probed under varied electrochemical potentials. The output and transfer characteristics of transistors made from undoped Te nanowires showed that the films started to conduct (drain current, $I_D$, increases sharply) when the interface potential ($V_G$) was biased negatively. This indicates that the film has positively charged holes available for conduction. More importantly, even at the highest positive bias the films were not conductive, which indicates that only holes are involved in charge transport, and hence $E_F$ lies close to the valence band edge. In contrast, for the heavily doped Te nanowire system (~2.4% sulfur atomic concentration), very little conduction when the films were negatively biased was observed, whereas there was a sharp turn-on upon positive bias with large electron conduction. This implies that the $E_F$ shifts closer to the conduction band edge—a signature of n-type doping.

Interestingly, while the doped Te-nanowires showed almost no hysteresis, the undoped ones showed a large hysteresis implying the presence of long-lived trap states. Referring to XRD and X-ray photoelectron spectroscopy (XPS) data, $TeO_2$ peaks were observed in the undoped nanowires and none for the doped ones. This lends further credence to the assumption that $S^{2-}$ dopants might be passivating any existing dangling bonds on unbound surface Te atoms and thus prevent surface oxidation, and/or possibly filling any existing mid-gap trap states.

Finally, for intermediate doping (~1.5% sulfur atomic concentration) where Seebeck coefficients are nearly 0 μV/K, both electron conduction and hole conduction were achieved—a classic case of ambipolar transport—indicating that the $E_F$ lies close to the middle of the band gap. These electrical transport trends support the hypothesis that the change in sign of the Seebeck coefficient is attributed to a shift in the $E_F$ due to $S^{2-}$ doping. To showcase the versatility of the surface doping technique, several different dopant compounds with $S^{2-}$ and $SH^-$ moieties under the same conditions were used, and in each and every case, n-type behavior was obtained, as shown in the Table below.

Typically, most current thermoelectric devices include a p-type and an n-type material based either on bulk crystals or SPS bulk nanostructured solids which are micro-machined or diced into rigid millimeter-thick pillar structures. These pillar structures are then serially assembled with metal interconnects. However, if the materials have substantially different conductivities (i.e., thermal or electrical), the legs need to be fabricated with different cross-sections. This considerably increases the complexity of device fabrication. Additionally, if there is a mismatch between the thermal expansion coefficients of the two thermoelectric materials, strain will develop in the thermoelectric device, leading to degradation of its structural integrity. During the dicing and assembly process, a significant fraction of material also is wasted. Rigid device designs also restrict deployment to somewhat limited applications where heat flux can be captured from flat surfaces with regular geometries.

Figure 7:
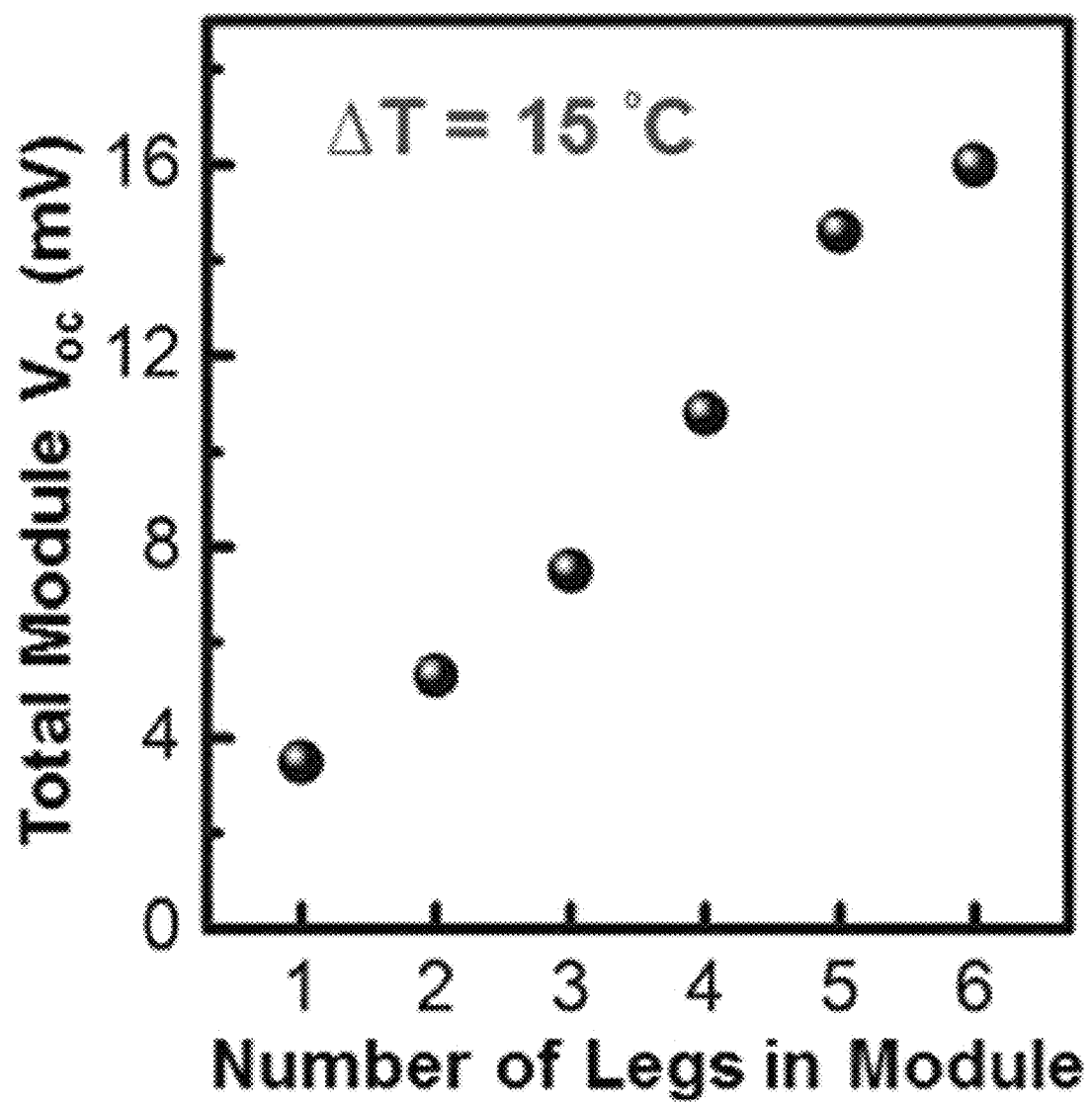
FIG. 7 shows the total device open circuit voltage ($V_{OC}$) generated as a result of the Seebeck effect as a function of the number of n- and p-type legs connected in series in the thermoelectric device.

As noted previously, colloidal nanowires provide the unique advantage of solution processability which can be utilized for cheap patterning on both rigid substrates and flexible substrates as well as introducing the possibility to realize more complex thermoelectric geometries or thermal energy harvesting fabrics that are challenging to fabricate with conventional bulk semiconductor thermoelectrics. These advantages allowed for the preparation of a thermoelectric generator (TEG) device in an unconventional thin film-leg geometry on a flexible Kapton-substrate simply by drop-casting doped and undoped Te nanowires onto the substrates in ambient conditions. FIG. 7 shows the performance of this "monomaterial" device wherein the 6 legs (3 p-type and 3 n-type) were connected electrically in series and thermally in parallel. Under a temperature gradient of nearly 15° C., the additive nature of the open-circuit voltage proves that the device functions as one would expect from a conventional TEG. Additionally, the n- and p-legs of the device have thermopower values that are of equal magnitude and opposite signs and show great self-consistency among the three legs respectively.

Figures 8A, 8B:
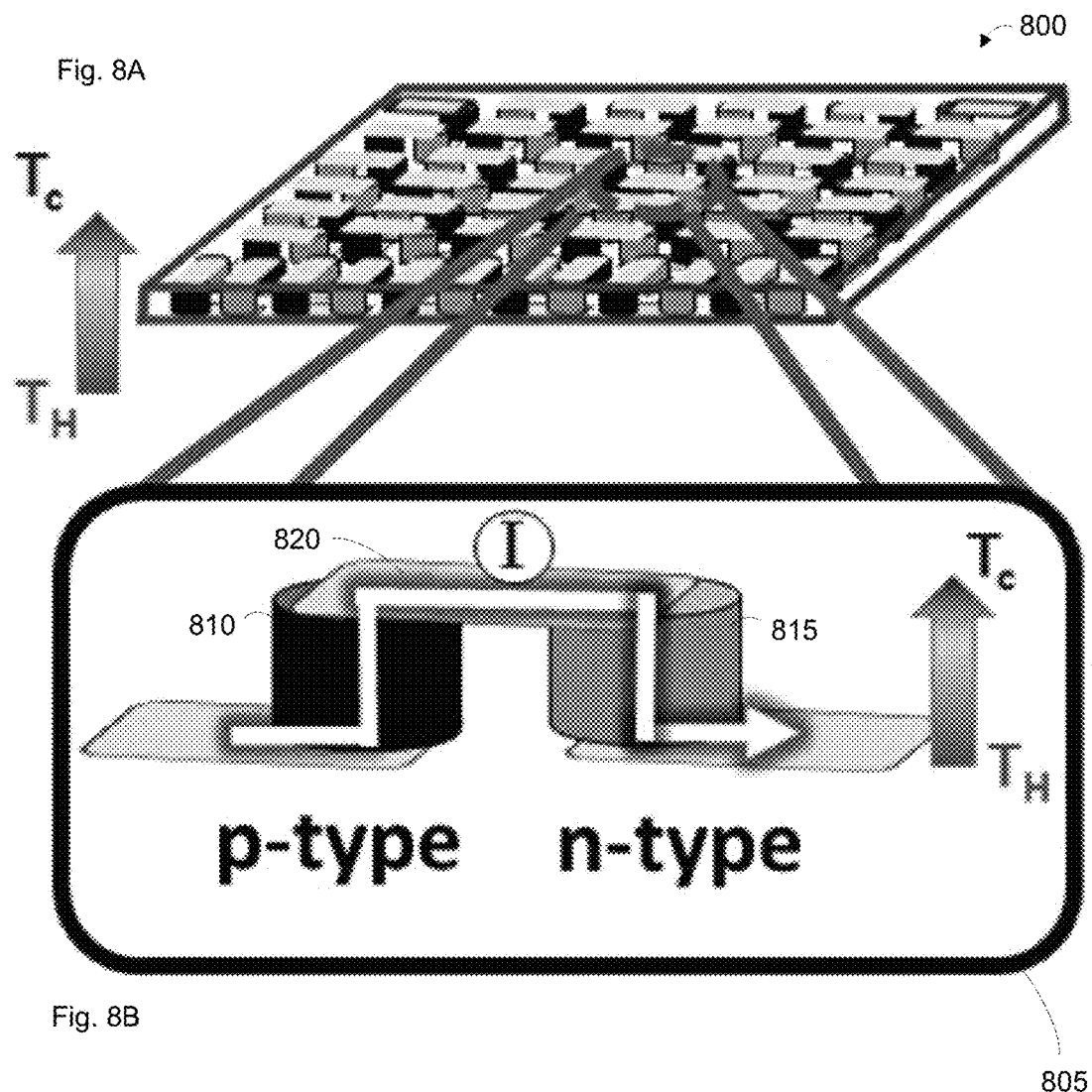
FIG. 8A shows an example of a schematic illustration of an array of thermoelectric devices.
FIG. 8B shows an example of a schematic illustration of an individual thermoelectric device.

These surface-doped nanostructured materials could also be used in a traditional pillar-like geometry (typically used for bulk or SPS sintered materials) for thermoelectric systems. FIG. 8A shows an example of a schematic illustration of an array of thermoelectric devices. FIG. 8B shows an example of a schematic illustration of an individual thermoelectric device.

The device 805 shown in FIG. 8B includes a first pillar 810 comprising a first plurality of nanostructures and a second pillar 815 comprising a second plurality of nanostructures. The first pillar has a first side and a second side. The first plurality of nanostructures comprise a semiconductor, with nanostructures of the first plurality of nanostructures being p-type semiconductors. The second pillar has a first side and a second side. The second plurality of nanostructures comprise the semiconductor, with nanostructures of the second plurality of nanostructures being surface-doped with doping species such that the nanostructures are

| Dopant | PVP (Undoped) | $Na_2S$ | NaHS | $(NH_4)_2S$ | $K_2S$ | KHS |
|---|---|---|---|---|---|---|
| S (μV/K) | 524 (±25) | −307 (±10) | −242 (±15) | −183 (±19) | −232 (±5) | −197 (±13) |
| σ (S/m) | 1.45 (±0.18) | 1.25 (±0.14) | 1.19 (±0.15) | 1.38 (±0.11) | 1.09 (±0.2) | 0.8 (±0.06) |

Table showing the Seebeck coefficient (S) and electrical conductivity (σ) of samples of ~10 nm diameter Te NW films using different dopant compounds.

n-type semiconductors. There is also an electrical connection 820 between the second side of the first pillar 810 and the second side of the second pillar 815. In some embodiments, the semiconductor is an n-type semiconductor, and surface doping nanostructures with doping species changes the nanostructures to p-type semiconductor.

In some embodiments, the semiconductor comprises tellurium and the doping species comprise sulfur. In some embodiments, the first pillar and the second pillar each have about the same height. In some embodiments, the first pillar and the second pillar each have about the same cross-sectional dimensions. The semiconductor and doping species may comprise any of the semiconductor and doping species combinations described herein that form thermoelectric materials.

In some embodiments, when the second side of the first pillar 810 and the second side of the second pillar 815 are at a lower temperature than the first side of the first pillar 810 and the first side of the second pillar 815, current flows from the first side of the first pillar 810 to the first side of the second pillar 815.

In an example implementation, to fabricate the thermoelectric devices describe above, doped and undoped Te nanowire dispersions were briefly agitated prior to deposition. Individual p-type and n-type legs were drop cast onto polyimide substrates (e.g., Kapton substrates) and dried at 90° C. on a hot plate. Electrical contacts were made using silver paint or thermally evaporated gold. The polyimide substrates were pre-cleaned with soap and water and exposed to 5 minutes of UV/Ozone treatment prior to nanowire dispersion deposition.

For creating a thermoelectric device with a traditional pillar-like geometry, a plastic mask with an array of equally-spaced holes (~4 mm diameter) was added overtop the polyimide substrate layer with pre-made bottom contacts. After deposition of ~100 μm of Te nanowire films (n-type/p-type) into alternate wells of the array, silver paint was used to create top contacts for the entire array. To establish a temperature gradient across the device, one side of the thermoelectric device was placed in contact with a hot plate/heating block, while the other side of the thermoelectric device was exposed to ambient air.

Figure 8C:
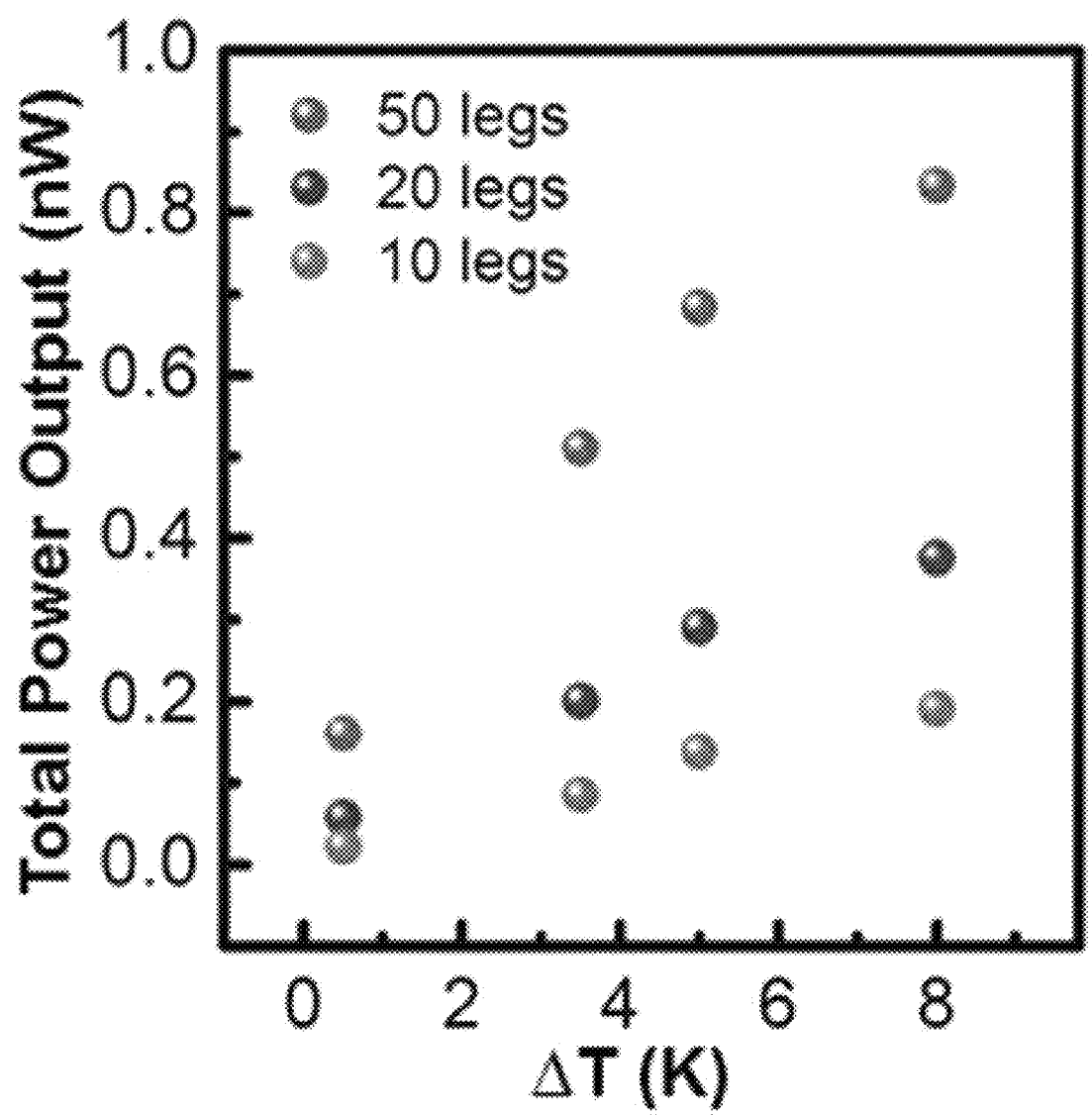
FIG. 8C shows the power output at various temperature gradients (ΔT) established across the array using the geometry shown in FIG. 8A for 10, 20, and 50 legs connected in series.

For demonstration purposes, a TEG array with 50 legs was fabricated, with each leg including an about ~100 micron thickness of active material and having a diameter of about 4 millimeters. The voltage (and thus power output) measured scaled almost linearly with the number of legs, as expected, and increased with increasing temperature difference across the TEG, as shown in FIG. 8C.

To establish device performance, electrical contact with the appropriate number of p/n legs in series was made using thin tip movable probes; the $V_{oc}$ generated by the thermoelectric device under a temperature difference was measured using a voltmeter. The associated thermally driven current (I) for a given temperature difference was calculated from the $V_{oc}$ and the measured resistance (R) at that temperature as $I=V_{oc}/R$. The power (P) was calculated as $P=I^2R=(V_{oc})^2/R$. No optimizations were performed using an external load resistance to derive peak power. All measurements were carried out under ambient conditions in air.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A material comprising:
    a plurality of tellurium nanowires, the plurality of tellurium nanowires comprising a p-type semiconductor, the plurality of tellurium nanowires consisting essentially of tellurium; and
    $S^{2-}$ or $SH^-$ species disposed on surfaces of each of the plurality of tellurium nanowires, charge carriers comprising electrons being transferred between the $S^{2-}$ or $SH^-$ species and the plurality of tellurium nanowires, the $S^{2-}$ or $SH^-$ species shifting the Fermi level of each the plurality of tellurium nanowires towards the conduction band, and the $S^{2-}$ or $SH^-$ species changing the plurality of tellurium nanowires to an n-type semiconductor.

2. The material of claim 1, wherein $S^{2-}$ species are disposed on surfaces of each of the plurality of tellurium nanowires, and wherein each of the plurality of nanowire has a sulfur atomic concentration of about 2.4%.

3. The material of claim 1, wherein the doping species do not desorb from the plurality of tellurium nanowires in a time period of over about 1 year.

4. The material of claim 1, wherein each of the plurality of tellurium nanowires has a diameter of about 10 nanometers to 500 nanometers and a length of about 100 nanometers to 50 microns.

5. A method comprising:
    (a) fabricating a plurality of tellurium nanowires with a solution-based process using a solvent, the plurality of tellurium nanowires comprising a p-type semiconductor, the plurality of tellurium nanowires consisting essentially of tellurium, each of the plurality of tellurium nanowires having a surface with capping species attached to the surface; and
    (b) mixing the plurality of tellurium nanowires in the solvent with a dopant compound that includes $S^{2-}$ or $SH^-$ species, during the mixing the capping species on the surfaces of each of the plurality of tellurium nanowires being replaced by the $S^{2-}$ or $SH^-$ species, charge carriers comprising electrons being transferred between the $S^{2-}$ or $SH^-$ species and each of the plurality of tellurium nanowires, the $S^{2-}$ or $SH^-$ species shifting a Fermi level of each of the plurality of tellurium nanowires towards the conduction band, and the plurality of tellurium nanowires being changed to an n-type semiconductor.

6. The method of claim 5, further comprising:
    depositing the plurality of nanowires on a substrate.

7. The method of claim 5, wherein the doping species have a larger binding energy to the surfaces of the plurality of nanowires than the capping species.

8. The method of claim 5, wherein all of the capping species are replaced by the doping species.

9. The method of claim 5, wherein a portion of the capping species are replaced by the doping species.

10. The method of claim 5, wherein operation (b) includes agitating the plurality of nanowires and the dopant compound in the solvent for about 24 hours to 48 hours.

11. The method of claim 5, wherein the doping species do not desorb from the plurality of nanowires in a time period of over about 1 year.

12. The method of claim 5, wherein each of the plurality of tellurium nanowires has a diameter of about 10 nanometers to 500 nanometers and a length of about 100 nanometers to 50 microns.

13. The method of claim 5, wherein the solvent comprises water.

14. The method of claim 5, wherein the dopant compound comprises a salt.

15. The method of claim 5, wherein the dopant compound is selected from a group consisting of $Na_2S$, $NaHS$, $(NH_4)_2S$, $K_2S$, and $KHS$.

16. The method of claim 5, wherein the plurality of tellurium nanowires is solution-processable after operation (b).

17. The method of claim 5, wherein the dopant compound includes $S^{2-}$ species, and wherein each of the plurality of nanowire has a sulfur atomic concentration of about 2.4%.

* * * * *